United States Patent
Cheon

(10) Patent No.: US 9,608,216 B2
(45) Date of Patent: Mar. 28, 2017

(54) FLEXIBLE DISPLAY DEVICE AND METHOD OF MANUFACTURING THE SAME

(71) Applicant: Samsung Display Co., Ltd., Yongin-si, Gyeonggi-do (KR)

(72) Inventor: Jun-Hyuk Cheon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/869,556

(22) Filed: Sep. 29, 2015

(65) Prior Publication Data

US 2016/0020417 A1 Jan. 21, 2016

Related U.S. Application Data

(62) Division of application No. 14/069,344, filed on Oct. 31, 2013, now Pat. No. 9,178,172.

(30) Foreign Application Priority Data

May 30, 2013 (KR) .......................... 10-2013-0061492

(51) Int. Cl.
*H01L 51/52* (2006.01)
*H01J 1/62* (2006.01)
(Continued)

(52) U.S. Cl.
CPC ...... *H01L 51/0097* (2013.01); *H01L 27/3262* (2013.01); *H01L 51/0004* (2013.01); *H01L 51/0005* (2013.01); *H01L 51/0008* (2013.01); *H01L 51/502* (2013.01); *H01L 51/5056* (2013.01); *H01L 51/5072* (2013.01); *H01L 51/5088* (2013.01); *H01L 51/5092* (2013.01);
(Continued)

(58) Field of Classification Search
CPC ......... B82Y 20/00; B82Y 30/00; B82Y 40/00; H01L 27/288; H01L 31/02322; H01L 31/035209; H01L 31/055; H01L 33/06; H01L 33/26; H01L 51/50; H01L 51/5012; H01L 51/502; H01L 51/5056; H01L 51/5072; H01L 51/5203; H01L 51/5296; H01L 2251/533
See application file for complete search history.

(56) References Cited

U.S. PATENT DOCUMENTS 7,436,577 B2 10/2008 Moriyama et al.
7,564,058 B2 7/2009 Yamazaki et al.
(Continued)

FOREIGN PATENT DOCUMENTS

KR 10-2004-0093948 A 11/2004
KR 10-2004-0100469 A 12/2004
KR 10-2005-0104065 A 11/2005

*Primary Examiner* — Pamela E Perkins
(74) *Attorney, Agent, or Firm* — Lewis Roca Rothgerber Christie LLP

(57) ABSTRACT

A flexible display device includes a flexible substrate including a display region and a peripheral region substantially surrounding the display region, the display region including a first display region and a second display region, a first display structure at the first display region of the flexible substrate, the first display structure including nanoparticles, and a second display structure at the second display region of the flexible substrate, the second display structure including silicon.

8 Claims, 10 Drawing Sheets

(51) Int. Cl.
  *G09G 5/00* (2006.01)
  *H01L 51/00* (2006.01)
  *H01L 51/56* (2006.01)
  *H01L 51/50* (2006.01)
  *H01L 27/32* (2006.01)

(52) U.S. Cl.
  CPC ........ *H01L 51/5203* (2013.01); *H01L 51/524* (2013.01); *H01L 51/56* (2013.01); *H01L 27/3244* (2013.01); *H01L 2251/5338* (2013.01); *H01L 2251/5369* (2013.01); *Y02E 10/549* (2013.01); *Y02P 70/521* (2015.11)

(56) References Cited

U.S. PATENT DOCUMENTS

| | | |
|---|---|---|
| 7,920,320 B2 | 4/2011 | Watson et al. |
| 8,704,443 B2 | 4/2014 | Nakamura et al. |
| 2004/0217423 A1 | 11/2004 | Park et al. |
| 2006/0207644 A1* | 9/2006 | Robinson ................ C23C 18/02 136/243 |
| 2007/0117298 A1 | 5/2007 | Fujimori et al. |
| 2007/0247422 A1* | 10/2007 | Vertegaal ................ G06F 3/017 345/156 |
| 2010/0053931 A1* | 3/2010 | Carroll ................... C09K 11/08 362/84 |
| 2010/0055810 A1* | 3/2010 | Sung ..................... C23C 14/042 438/22 |
| 2010/0240173 A1 | 9/2010 | Fujii |
| 2011/0062481 A1* | 3/2011 | Oyamada ............... B82Y 20/00 257/98 |
| 2013/0221840 A1* | 8/2013 | Oh ...................... H01L 51/5237 313/511 |
| 2014/0319491 A1 | 10/2014 | Yoshida et al. |
| 2014/0339578 A1 | 11/2014 | Jinbo et al. |

* cited by examiner

FLEXIBLE DISPLAY DEVICE AND METHOD OF MANUFACTURING THE SAME

CROSS-REFERENCE TO RELATED APPLICATION(S)

This application is a divisional of U.S. patent application Ser. No. 14/069,344, filed Oct. 31, 2013, which claims priority to and the benefit of Korean Patent Application No. 10-2013-0061492, filed May 30, 2013, the entire content of both of which is incorporated herein by reference.

BACKGROUND

1. Field

Aspects of embodiments of the present invention relate generally to an electronic device. More particularly, embodiments of the present invention relate to a flexible display device capable of being completely folded, and a method of manufacturing the flexible display device.

2. Description of the Related Art

A flexible display device has been recently developed which can be bent by using a flexible substrate or film made of a bendable material such as a plastic. Such a flexible display device has properties of thinness, lightness, impact resistance, as well as flexibility, which may result in an infinite range of applications in the future due to its high manufacturability. Further, various shapes or forms of mobile devices employing such flexible display devices have been recently researched and developed.

The flexible display device may generally include a flexible substrate or film on which silicon devices are disposed. However, flexibility of the flexible display device may be limited by the silicon devices.

SUMMARY

Example embodiments provide a flexible display device capable of being completely folded.

Example embodiments provide a method of manufacturing the flexible display device.

According to some example embodiments, a flexible display device includes a flexible substrate including a display region and a peripheral region substantially surrounding the display region, the display region including a first display region and a second display region, a first display structure at the first display region of the flexible substrate, the first display structure including nanoparticles, and a second display structure at the second display region of the flexible substrate, the second display structure including silicon.

The flexible display device may further include a housing on a back side of the flexible substrate, the housing including a flexible material and adapted to enable a folding operation of the flexible display device.

The flexible display device may further include a housing on a back side of the flexible substrate, the housing including a non-flexible material, and the housing including a hinge adapted to enable a folding operation of the flexible display device.

The first display region and the second display region may be continuously arranged, and the second display region may be at both sides of the first display region.

The first display structure may include a switching element on the flexible substrate, a first electrode electrically connected to the switching element, a light emitting structure on the first electrode, and a second electrode on the light emitting structure, and at least one of the switching element, the first electrode, the light emitting structure, and the second electrode may include the nanoparticles.

The light emitting structure may include the nanoparticles, the light emitting structure may include a first organic layer, an organic light emitting layer on the first organic layer, and a second organic layer on the organic light emitting layer, and at least one of the first organic layer, the organic light emitting layer, and the second organic layer may include the nanoparticles.

The first organic layer may include at least one of a hole injection layer and a hole transport layer.

The second organic layer may include at least one of an electron transport layer and an electron injection layer.

The nanoparticles may include at least one of a carbon nano tube, a quantum dot, graphene, and fullerene.

The silicon may include at least one of amorphous silicon, polycrystalline silicon, and polysilicon.

According to some example embodiments, a method of manufacturing of the flexible display device includes providing a flexible substrate including a display region and a peripheral region substantially surrounding the display region, the display region including a first display region and a second display region, forming a first display structure at the first display region of the flexible substrate, the first display structure including nanoparticles, and forming a second display structure at the second display region of the flexible substrate, the second display structure including silicon.

The method may further include forming a housing on a back side of the flexible substrate, the housing including a flexible material and adapted to enable a folding operation of the flexible display device.

The method may further include forming a housing on a back side of the flexible substrate, the housing including a non-flexible material, and the housing including a hinge adapted to enable a folding operation of the flexible display device.

The first display region and the second display region may be continuously arranged, and the second display region may be at both sides of the first display region.

Forming the first display structure may include forming a switching element on the flexible substrate, forming a first electrode electrically connected to the switching element, forming a light emitting structure on the first electrode, and forming a second electrode on the light emitting structure, and at least one of the switching element, the first electrode, the light emitting structure, and the second electrode may include the nanoparticles.

The light emitting structure may include the nanoparticles, forming the light emitting structure may include forming a first organic layer, forming an organic light emitting layer on the first organic layer, and forming a second organic layer on the organic light emitting layer, and at least one of the first organic layer, the organic light emitting layer, and the second organic layer may include the nanoparticles.

The light emitting structure may be formed by at least one of an inkjet printing process, a screen printing process, a nozzle printing process, a spray coating process, a slit coating process, a bar coating process, and a spin coating process.

In example embodiments, the first organic layer may include at least one of a hole injection layer and a hole transport layer, and the second organic layer includes at least one of an electron transport layer and an electron injection layer.

In example embodiments, the nanoparticles may include at least one of a carbon nano tube, a quantum dot, graphene, and fullerene.

In example embodiments, the silicon may include at least one of amorphous silicon, polycrystalline silicon, and polysilicon.

Therefore, a flexible display device according to example embodiments includes a first display structure. In this case, the first display structure may include nanoparticles. Accordingly, the flexible display device according to example embodiments may improve flexibility of the flexible display device. When the flexible display device is substantially bent or curved, damage to the flexible display device may be prevented or mitigated due to the nanoparticles of the first display structure.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
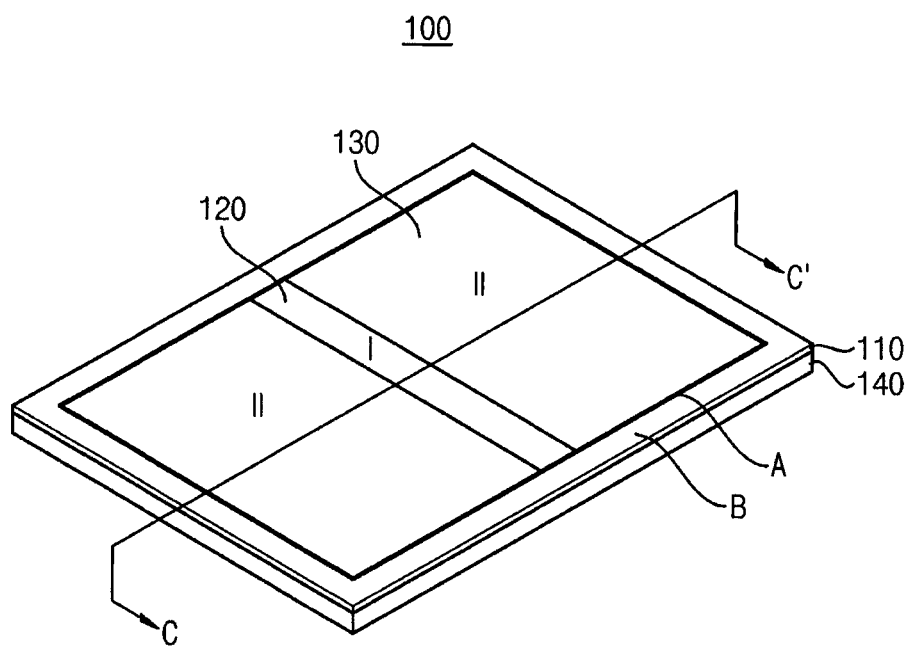
FIG. 1 is a perspective view illustrating a flexible display device in accordance with example embodiments of the present invention.

Various example embodiments will be described more fully hereinafter with reference to the accompanying drawings, in which some example embodiments are shown. Aspects of embodiments of the present invention may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as including a meaning that is consistent with their meaning in the context of the relevant art and will not be interpreted in an idealized or overly formal sense unless expressly so defined herein.

FIG. 1 is a perspective view illustrating a flexible display device in accordance with example embodiments of the present invention.

Referring to FIG. 1, a flexible display device 100 may include a flexible substrate 110, a first display structure 120, a second display structure 130, a housing 140, etc.

The flexible substrate 110 may have flexibility. In example embodiments, the flexible substrate 110 may include polyimide-based resin, acryl-based resin, polyacrylate-based resin, polyethyleneterephthalate-based resin, polycarbonate-based resin, sulfonic acid-based resin, polyether-based resin, etc.

A buffer layer may be disposed on the flexible substrate 110. In example embodiments, the buffer layer may prevent (or mitigate) diffusion of metal atoms and/or impurities from the flexible substrate 110. In case that the flexible substrate 110 has a relatively irregular surface, the buffer layer may improve flatness of the surface of the flexible substrate 110.

The buffer layer may be formed using silicon compound. For example, the buffer layer may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), etc. These may be used alone or in a mixture (or combinations) thereof.

The flexible substrate 110 may include a display region (A) and a peripheral region (B) substantially surrounding the display region (A). In example embodiments, the display region (A) may include a first display region I and a second display region II based on (or located in accordance with) a folding region of the flexible display device 100. In this case, the first display region I and the second display region II may be continuously disposed on (or arranged or located on) the flexible substrate 110 (e.g., there is substantially no gap between the first display region I and the second display region II or the first display region I and the second display region II may be contiguously disposed). The first display region I may be disposed (or located) at the folding region of the flexible display device 100, and the second display region II may be disposed (or located) at both sides of the first display region I. Accordingly, the second display region II may include a left second display region and a right second display region.

The first display structure 120 may be disposed at the first display region I, and the second display structure 130 may be disposed at the second display region II. In example embodiments, the first display structure 120 and the second display structure 130 may include a switching element disposed on the flexible substrate 110, a first electrode electrically connected to the switching element, a light emitting structure disposed on the first electrode, a second electrode disposed on the light emitting structure, etc. In this case, at least one of the switching element, the first electrode, the light emitting structure, and the second electrode may include a nanoparticle (or nanoparticles). The nanoparticle may include at least one of a carbon nano tube, a quantum dot, graphene, and fullerene. As described above, the first display region I may be disposed at the folding region of the flexible display device 100. Accordingly, a folding operation of the flexible display device 100 may be improved (e.g., the flexible display device 100 can be folded at the folding region). Although it is illustrated that the first display structure 120 is disposed at the center of the flexible display device 100 in FIG. 1, it should be understood that the first display structure 120 may be disposed at another region of the flexible display device 100 based on (or located in accordance with) a folding position of the flexible display device 100.

Although it is described that the flexible display device 100 may be folded and/or unfolded in FIG. 1, it should understood that the flexible display device 100 may be bent and/or curved along various directions and/or angels (e.g., predetermined directions and/or angles).

In example embodiments, the light emitting structure includes a first organic layer, an organic light emitting layer disposed on the first organic layer, and a second organic layer disposed on the organic light emitting layer. In this case, at least one of the first organic layer, the organic light emitting layer, and the second organic layer may include a nanoparticle (or nanoparticles). The nanoparticle may include at least one of a carbon nano tube, a quantum dot, graphene, and fullerene.

In example embodiments, the first organic layer may include at least one of a hole injection layer and a hole transport layer.

In embodiments in which the first organic layer includes the hole injection layer, the hole injection layer may include a hole injection material, for example, CuPc (copper phthalocyanine), PEDOT (poly(3,4)-ethylenedioxythiophene), PANI (polyaniline), etc., however, materials in the hole injection layer are not limited thereto.

In embodiments in which the first organic layer includes the hole transport layer, the hole transport layer may include a hole transport material, for example, 4,4'-bis[N-(1-naphtyl)-N-phenylamino]biphenyl (NPB), N,N'-diphenyl-N,N'-bis(3-methylphenyl)-1,1'-biphenyl-4,4-diamine (TPD), N,N'-di-1-naphtyl-N,N'-diphenyl-1,1'-biphenyl-4,4'-diamine (NPD), N-phenylcarbazole, polyvinylcarbazole, etc., however, materials in the hole transport layer are not limited thereto.

In example embodiments, the second organic layer includes at least one of an electron transport layer and an electron injection layer.

In embodiments in which the second organic layer includes the electron transport layer, the electron transport layer may include an electron transport material, for example, tris(8-quinolinolato)aluminum (III) (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), etc., however, materials in the electron transport layer are not limited thereto.

In embodiments in which the second organic layer includes the electron injection layer, the electron injection layer may be formed using inorganic materials, for example, an alkaline metal, an alkaline earth metal, fluorides of these metals, oxides of these metals, etc. Alternatively, the electron injection layer may be formed using organic materials, for example, Alq3, PBD, etc.

Therefore, the flexible display device 100 according to example embodiments includes the first display structure 120 having a nanoparticle (or nanoparticles). Accordingly, the flexible display device 100 according to example embodiments of the present invention may improve flexibility of the flexible display devices. When the flexible display device 100 is substantially bent or curved, damage to the flexible display device 100 may be prevented or mitigated due to the first display structure 120. Configurations of the first and second display structures 120 and 130 will be described below in more detail.

The housing 140 may be disposed on a back side of the flexible substrate 110. In example embodiments, the housing 140 may have (or be made of) a flexible material and may support a folding operation of the flexible display device 100. Alternatively, the housing 140 may have a non-flexible material, and may include a hinge that supports a folding operation of the flexible display device 100.

Figure 2:
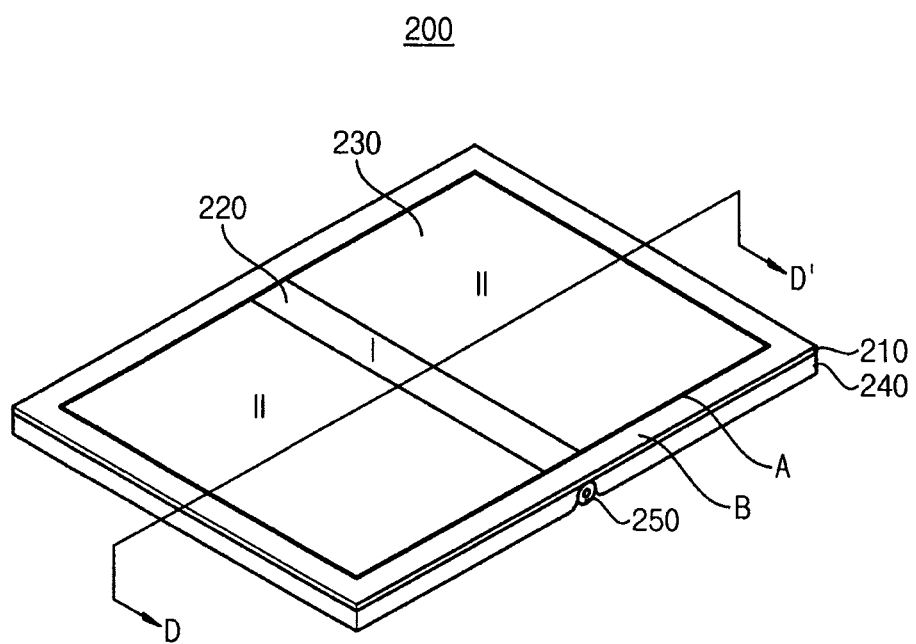
FIG. 2 is a perspective view illustrating a flexible display device in accordance with example embodiments of the present invention.

FIG. 2 is a perspective view illustrating a flexible display device in accordance with example embodiments of the present invention.

Referring to FIG. 2, a flexible display device 200 may include a flexible substrate 210, a first display structure 220, a second display structure 230, a housing 240, a hinge 250, etc. Because the flexible display device 200 of FIG. 2 has a structure substantially the same as or substantially similar to the flexible display device 100 of FIG. 1, except for the housing 240 and the hinge 250, descriptions of substantially similar components will not be repeated below.

The flexible substrate 210 may include flexibility (or may be flexible). In example embodiments, the flexible substrate 210 may include polyimide-based resin, acryl-based resin, polyacrylate-based resin, polyethyleneterephthalate-based resin, polycarbonate-based resin, sulfonic acid-based resin, polyether-based resin, etc.

A buffer layer may be disposed on the flexible substrate 210. In example embodiments, the buffer layer may prevent (or mitigate) diffusion of metal atoms and/or impurities from the flexible substrate 210. In cases where the flexible substrate 210 has a relatively irregular surface, the buffer layer may improve flatness of the surface of the flexible substrate 210.

The flexible substrate 210 may include a display region (A) and a peripheral region (B) substantially surrounding the display region (A). In example embodiments, the display region (A) may include a first display region I and a second display region II based on (or located in accordance with) a folding region of the flexible display device 200. In this case, the first display region I and the second display region II may be continuously disposed (or arranged) on the flexible substrate 210. The first display region I may be disposed on the folding region of the flexible display device 200, and the second display region II may be disposed at both sides of the first display region I. Accordingly, the second display region II may include a left second display region and a right second display region.

The first display structure 220 may be disposed at the first display region I, and the second display structure 230 may be disposed at the second display region II. In example embodiments, the first display structure 220 and the second display structure 230 includes a switching element disposed on the flexible substrate 210, a first electrode electrically connected to the switching element, a light emitting structure disposed on the first electrode, a second electrode disposed on the light emitting structure, etc. In this case, at least one of the switching element, the first electrode, the light emitting structure, and the second electrode may include a nanoparticle (or nanoparticles). The nanoparticle may include at least one of a carbon nano tube, a quantum dot, graphene, and fullerene. As illustrated above, the first display region I may be disposed on the folding region of the flexible display device 200. Accordingly, a folding operation of the flexible display device 200 may be improved. Although it is described that the first display structure 220 may be disposed on the folding region of the flexible display device 200 (e.g., center of the flexible display device 200) in FIG. 1, it should understood that the first display structure 220 may be disposed in other regions of the flexible display device 200 based on (or located in accordance with) a folding position of the flexible display device 200 (e.g., the location at which the flexible display device 200 is or can be folded).

Although the flexible display device 200 is described as being folded and/or unfolded in FIG. 2, it should understood that the flexible display device 200 may also be bent and/or curved at various directions and/or angles (e.g., with a predetermined direction and/or angle).

In example embodiments, the light emitting structure includes a first organic layer, an organic light emitting layer disposed on the first organic layer, and a second organic layer disposed on the organic light emitting layer. In this case, at least one of the first organic layer, the organic light emitting layer, and the second organic layer may include a nanoparticle (or nanoparticles). The nanoparticle may include at least one of a carbon nano tube, a quantum dot, graphene, and fullerene.

In example embodiments, the first organic layer may include at least one of a hole injection layer and a hole transport layer.

In embodiments in which the first organic layer includes the hole injection layer, the hole injection layer may include a hole injection material, for example, CuPc (copper phthalocyanine), PEDOT (poly(3,4)-ethylenedioxythiophene), PANI (polyaniline), etc., however, materials in the hole injection layer are not limited thereto.

In embodiments in which the first organic layer includes the hole transport layer, the hole transport layer may include a hole transport material, for example, 4,4'-bis[N-(1-naphtyl)-N-phenylamino]biphenyl (NPB), N,N'-diphenyl-N,N'-bis(3-methylphenyl)-1,1'-biphenyl-4,4-diamine (TPD), N,N'-di-1-naphtyl-N,N'-diphenyl-1,1'-biphenyl-4,4'-diamine (NPD), N-phenylcarbazole, polyvinylcarbazole, etc., however, materials in the hole transport layer are not limited thereto.

In example embodiments, the second organic layer may include at least one of an electron transport layer and an electron injection layer.

In embodiments in which the second organic layer includes the electron transport layer, the electron transport layer may include an electron transport material, for example, tris(8-quinolinolato)aluminum (III) (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), etc., however, materials in the electron transport layer are not limited thereto.

In embodiments in which the second organic layer includes the electron injection layer, the electron injection layer may be formed using inorganic materials, for example, an alkaline metal, an alkaline earth metal, fluorides of these metals, oxides of these metals, etc. Alternatively, the electron injection layer may be formed using organic materials, for example, Alq3, PBD, etc.

Therefore, the flexible display device 200 according to example embodiments may include the first display structure 220. In this case, the first display structure 220 may include a nanoparticle (or nanoparticles). Accordingly, the flexible display device 200 according to example embodiments of the present invention may improve the flexibility of flexible display device. When the flexible display device 200 is substantially bent or curved, damage to the flexible display device 200 may be prevented or mitigated due to the first display structure 220.

In example embodiments, the housing 240 may be disposed on a back side of the flexible substrate 210. The housing 240 may have a hinge 250 that has a flexible material and supports or enables a folding operation of the flexible display device 200. In other example embodiments, the housing 240 has a hinge 250 that has a non-flexible material and supports or enables a folding operation of the flexible display device 200.

Figure 3:
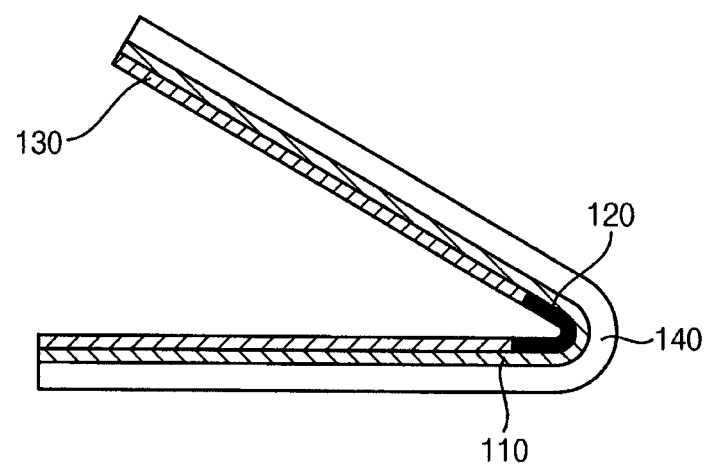
FIGS. 3 and 4 are diagrams illustrating examples of operations of a flexible display device of FIG. 1.
Figure 4:
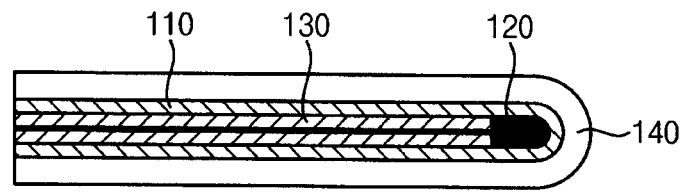

FIGS. 3 and 4 are diagrams illustrating examples of operations of a flexible display device of FIG. 1.

Referring to FIG. 3, the flexible substrate 110 may include a display region and a peripheral region. In example embodiments, the display region may include a first display region I and a second display region II based on (or located in accordance with) a folding region of the flexible display device 100. The first display structure 120 may be disposed at the first display region I, and the second display structure 130 may be disposed at the second display region II.

In example embodiments, the first display structure 120 includes a nanoparticle which may be at least one of a carbon nano tube, a quantum dot, graphene, and fullerene. The second display structure 130 may include at least one of amorphous silicon, polycrystalline silicon, and polysilicon. That is, the flexible display device 100 may include the first display region I disposed on the folding region of the flexible display device 100. Flexibility of the flexible display device 100 may be improved due to the first display region I including the nanoparticle.

The housing 140 may have a flexible material and may support or enable a folding operation of the flexible display device. When the housing 140 is folded and/or unfolded by a user, the flexible display device 100 may be folded and/or unfolded.

Referring to FIG. 4, when the flexible display device 100 is folded at an angle (e.g., a predetermined angle), the flexible display device 100 may include the first display structure 110 disposed on the first display region I. In this case, the first display structure 110 may include a nanoparticle which may be at least one of a carbon nano tube, a quantum dot, graphene, and fullerene. The first display structure 110 may be formed on (or in) the folding region of the flexible display device 100 so that the flexible display device 100 may be completely folded. As a result, portability of the flexible display device 100 may be improved.

Figure 5:
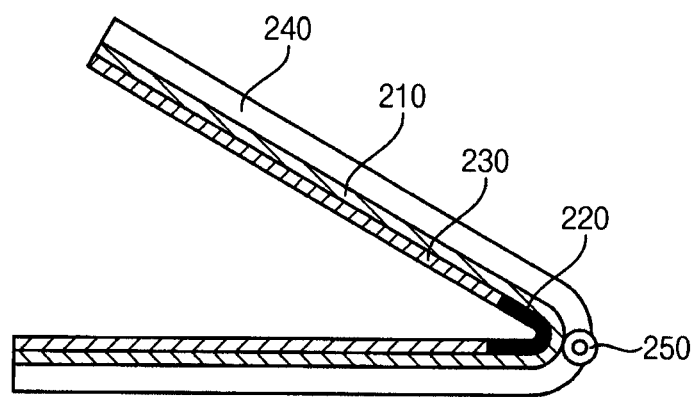
FIGS. 5 and 6 are diagrams illustrating examples of operations of a flexible display device of FIG. 2.
Figure 6:
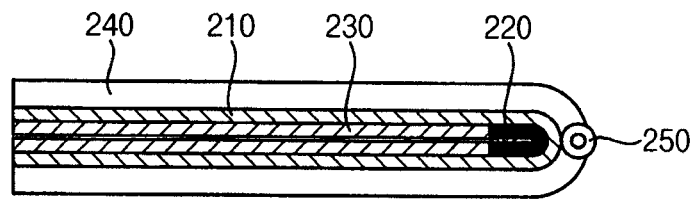

FIGS. 5 and 6 are diagrams illustrating examples of operations of a flexible display device of FIG. 2.

Referring to FIG. 5, the flexible substrate 210 may include a display region and a peripheral region. In example embodiments, the display region includes a first display region I and a second display region II based on (or located in accordance with) a folding region of the flexible display device 200. The first display structure 220 may be disposed at (or located in) the first display region I, and the second display structure 230 may be disposed at (or located in) the second display region II.

In example embodiments, the first display structure 220 includes a nanoparticle which may be at least one of a carbon nano tube, a quantum dot, graphene, and fullerene. The second display structure 230 may include at least one of amorphous silicon, polycrystalline silicon, and polysilicon. That is, the flexible display device 200 may include the first display region I disposed on the folding region of the flexible display device 200. Flexibility of the flexible display device 200 may be improved due to the first display region I including the nanoparticle.

In example embodiments, the housing 240 may have a flexible material and may support or enable a folding operation of the flexible display device 200. Alternatively, the housing 240 may have a non-flexible material and may support a folding operation of the flexible display device 200. When the housing 240 is folded and/or unfolded by a user, the flexible display device 200 may be folded and/or unfolded.

Referring to FIG. 6, when the flexible display device 200 is folded at an angle (e.g., a predetermined angle), the flexible display device 200 may include the first display structure 210 disposed on the first display region I. In this case, the first display structure 210 may include at least one of a carbon nano tube, a quantum dot, graphene, and fullerene. The first display structure 210 may be formed on the folding region of the flexible display device 200 so that the flexible display device 200 may be completely folded. As a result, portability of the flexible display device 200 may be improved.

Figure 7:
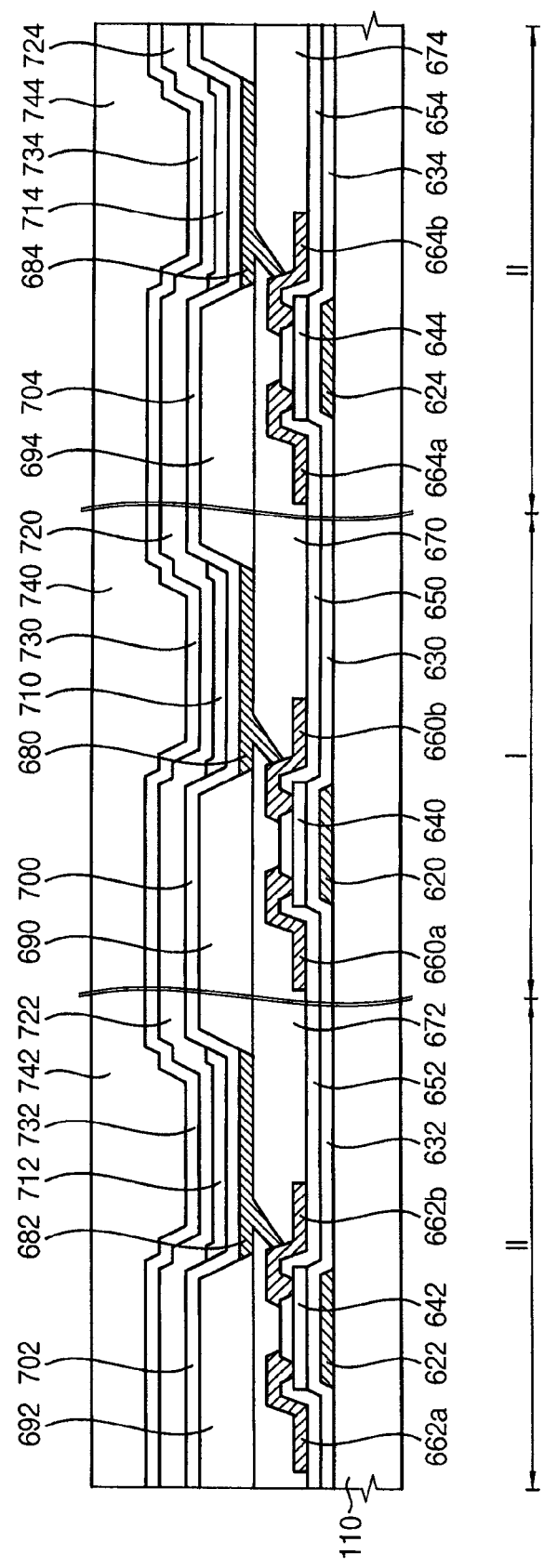
FIG. 7 is a cross-sectional view taken along a line C-C' of FIG. 1 and a line D-D' of FIG. 2.

FIG. 7 is a cross-sectional view taken along a line C-C' of FIG. 1 and a line D-D' of FIG. 2.

Referring to FIGS. 1, 2, and 7, a first display structure 120 illustrated in FIG. 1 and a first display structure 220 illustrated in FIG. 2 may be disposed at a first display region I of a flexible substrate 110, and a second display structure 130 illustrated in FIG. 1 and a second display structure 230 illustrated in FIG. 2 may be disposed at a second display region II of a flexible substrate 110. The first display structures 120, 220 and the second display structures 130, 230 may include a switching element disposed on the flexible substrate 110, first electrodes 680, 682, 684, a light emitting structure, and second electrodes 730, 732, 734, etc. For example, the flexible display device in FIG. 7 may be a bottom emission type display device.

The switching element may be disposed at the first display region I. The first electrode 680 may be disposed on the switching element and may be electrically connected to the switching element. The light emitting structure may be disposed between the first electrode 680 and the second electrode 730.

In embodiments in which the flexible display device 100 has an active matrix type display, the switching element may be disposed between the flexible substrate 110 and the first electrode 680. In example embodiments, the switching element includes a switching device (e.g., a thin film transistor), a plurality of insulating layers, etc.

As described above, the switching element may include the thin film transistor including a gate electrode 620, a gate insulation layer 630, an active layer 640, a first insulating interlayer 650, a source electrode 660a, a drain electrode 660b, etc.

In example embodiments, at least one of the gate electrode 620, the gate insulation layer 630, the active layer 640, the first insulating interlayer 650, the source electrode 660a and the drain electrode 660b include a nanoparticle (or nanoparticles). In this case, the nanoparticle may include at least one of a carbon nano tube, a quantum dot, graphene, and fullerene. That is, a flexible display device 100 according to example embodiments includes the first display structure having the nanoparticle. As a result, flexibility of the flexible display device 200 may be improved.

The gate electrode 620 may receive a gate signal, and the source electrode 660a may receive a data signal. In example embodiments, the drain electrode 660b may be electrically connected to the first electrode 680, and the active layer 640 may make contact with the source electrode 660a and the drain electrode 660b.

In the switching device described with reference to FIG. 7, the switching device including the thin film transistor may have a top gate structure in which the gate electrode 620 may be disposed on the active layer 640, however, the configuration of the switching device is not limited thereto. For example, the switching device may have a bottom gate structure in which the gate electrode 620 may be disposed under the active layer 640.

The light emitting structure may include a first organic layer 700, an organic light emitting layer 710, and a second organic layer 720.

In example embodiments, the first organic layer 700 may include at least one of a hole injection layer and a hole transport layer.

In embodiments in which the first organic layer 700 includes the hole injection layer, the hole injection layer may include a hole injection material, for example, CuPc (copper phthalocyanine), PEDOT (poly(3,4)-ethylenedioxythiophene), PANI (polyaniline), etc., however, materials in the hole injection layer are not limited thereto.

In embodiments in which the first organic layer 700 includes the hole transport layer, the hole transport layer may include a hole transport material, for example, 4,4'-bis [N-(1-naphtyl)-N-phenylamino]biphenyl (NPB), N,N'-diphenyl-N,N'-bis(3-methylphenyl)-1,1'-biphenyl-4,4-diamine (TPD), N,N'-di-1-naphtyl-N,N'-diphenyl-1,1'-biphenyl-4,4'-diamine (NPD), N-phenylcarbazole, polyvinylcarbazole, etc., however, materials in the hole transport layer are not limited thereto.

In example embodiments, the second organic layer 720 may include at least one of an electron transport layer and an electron injection layer.

In embodiments in which the second organic layer 720 includes the electron transport layer, the electron transport layer may include an electron transport material, for example, tris(8-quinolinolato)aluminum (III) (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), etc., however, materials in the electron transport layer are not limited thereto.

In embodiments in which the second organic layer 720 includes the electron injection layer, the electron injection layer may be formed using inorganic materials, for example, an alkaline metal, an alkaline earth metal, fluorides of these metals, oxides of these metals, etc. Alternatively, the electron injection layer may be formed using organic materials, for example, Alq3, PBD, etc.

The organic light emitting layer 710 may include an organic material or a mixture of an organic material and an inorganic material for generating a red color of light, a green color of light and/or a blue color of light. Alternatively, the organic light emitting layer 710 may have a stacked structure that includes a plurality of light emitting films for generating the red color of light, the green color of light and the blue color of light to thereby provide a white color of light.

In example embodiments, at least one of the first organic layer 700, the organic light emitting layer 710, and the second organic layer 720 may include the nanoparticle. In this case, the nanoparticle may include at least one of the carbon nano tube, the quantum dot, graphene, and fullerene.

Therefore, the flexible display device 100 according to example embodiments includes the first display structure 120. In this case, the first display structure 120 may include a nanoparticle (or nanoparticles). Accordingly, the flexible display device 100 according to example embodiments of the present invention may improve flexibility of flexible display devices. When the flexible display device 100 is substantially bent or curved, damage to the flexible display device 100 may be prevented or mitigated due to the first display structure 120.

The first electrode 680 may be disposed between the switching structure and the light emitting structure. The second electrode 730 may be disposed between the light emitting structure and the second substrate 660. A pixel defining layer 690 may be disposed at a region between the switching structure and the light emitting structure where the first electrode 680 is not positioned.

In example embodiments, the first electrode 680 may serve as an anode for providing holes into the hole transfer layer 700 of the light emitting structure, and the second electrode 730 may serve as a cathode for supplying electrons into the electron transfer layer 720. Depending on an emission type of the organic light emitting display device 600, the first electrode 680 may be a transparent electrode or a semi-transparent electrode, and the second electrode 730 may be a reflective electrode. For example, the first electrode 680 may include a transparent conductive material such as indium tin oxide, zinc tin oxide, indium zinc oxide, zinc oxide, tin oxide, gallium oxide, etc. The second electrode 730 may include a reflective material such as aluminum, tungsten, copper, nickel, chromium, molybdenum, titanium, platinum, silver, tantalum, ruthenium, alloys thereof, nitrides thereof, etc.

An upper substrate 740 may be disposed on the second electrode 730. The upper substrate 740 may include a flexible substrate. In example embodiments, the flexible substrate 110 and the upper substrate 740 may include substantially the same materials or different materials. In this case, the flexible substrate 110 may correspond to a lower substrate.

Referring now to FIG. 7, because the second display structures 130 and 230 of FIGS. 1 and 2 have a structure substantially the same as or substantially similar to the first display structures 120 and 220 of FIGS. 1 and 2, duplicated descriptions will be omitted below.

The second display structure of FIG. 7 may be disposed at both sides of the first display region I. (e.g., the second display structure may be disposed on the second display region II having the left second display region and the right second display region.) In FIG. 7, the second display structure may be disposed on the left second display region. Alternatively, the second display structure may be disposed on the right second display region. Hereinafter, for the sake of convenience, only the case in which the second display structure is disposed on the left second display region will be illustrated. However, it should understood that the second display structure disposed on the left second display region has a structure substantially the same as or substantially similar to the second display structure disposed on the right second display region.

In example embodiments, the second display structure is provided with the flexible substrate 110 and includes a first electrode 682, a light emitting structure, a second electrode 732, etc.

The switching element may be disposed at the first display region I. The first electrode 682 may be disposed on the switching element and may be electrically connected to the switching element. The light emitting structure may be disposed between the first electrode 682 and the second electrode 732.

In embodiments in which the flexible display device 100 has an active matrix type display, the switching element may be disposed between the flexible substrate 110 and the first electrode 682. In example embodiments, the switching element includes a switching device (e.g., a thin film transistor), a plurality of insulating layers, etc.

As described above, the switching element may include the thin film transistor including a gate electrode 622, a gate insulation layer 632, an active layer 642, a first insulating interlayer 652, a source electrode 662a, a drain electrode 662b, etc.

The active layer 642 may include silicon. In example embodiments, the silicon may include at least one of amorphous silicon, polycrystalline silicon, and polysilicon.

The light emitting structure may include a first organic layer 702, an organic light emitting layer 712, and a second organic layer 722.

In example embodiments, the first organic layer 702 may include at least one of a hole injection layer and a hole transport layer.

In embodiments in which the first organic layer 702 includes the hole injection layer, the hole injection layer may include a hole injection material, for example, CuPc (copper phthalocyanine), PEDOT (poly(3,4)-ethylenedioxythiophene), PANI (polyaniline), etc., however, materials in the hole injection layer are not limited thereto.

In embodiments in which the first organic layer 702 includes the hole transport layer, the hole transport layer may include a hole transport material, for example, 4,4'-bis [N-(1-naphtyl)-N-phenylamino]biphenyl (NPB), N,N'-diphenyl-N,N'-bis(3-methylphenyl)-1,1'-biphenyl-4,4-diamine (TPD), N,N'-di-1-naphtyl-N,N'-diphenyl-1,1'-biphenyl-4,4'-diamine (NPD), N-phenylcarbazole, polyvinylcarbazole, etc., however, materials in the hole transport layer are not limited thereto.

In example embodiments, the second organic layer 722 may include at least one of an electron transport layer and an electron injection layer.

In embodiments in which the second organic layer 722 includes the electron transport layer, the electron transport layer may include an electron transport material, for example, tris(8-quinolinolato)aluminum (III) (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), etc., however, materials in the electron transport layer are not limited thereto.

In embodiments in which the second organic layer 722 includes the electron injection layer, the electron injection layer may be formed using inorganic materials, for example, an alkaline metal, an alkaline earth metal, fluorides of these metals, oxides of these metals, etc. Alternatively, the electron injection layer may be formed using organic materials, for example, Alq3, PBD, etc.

The organic light emitting layer 712 may include an organic material or a mixture of an organic material and an inorganic material for generating a red color of light, a green color of light and/or a blue color of light. Alternatively, the organic light emitting layer 712 may have a stacked structure that includes a plurality of light emitting films for generating the red color of light (or red light), the green color of light (or green light) and the blue color of light (or blue light) to thereby provide a white color of light (or white light).

The first electrode 682 may be disposed or located between the switching structure and the light emitting structure. The second electrode 732 may be disposed or located between the light emitting structure and the upper substrate 742. A pixel defining layer 692 may be disposed at or located in a region between the switching structure and the light emitting structure where the first electrode 682 is not positioned or located.

In example embodiments, the first electrode 682 may serve as an anode for providing holes into the hole transfer layer of the light emitting structure, and the second electrode 732 may serve as a cathode for supplying electrons into the electron transfer layer 720. Depending on an emission type of the organic light emitting display device 600, the first electrode 682 may be a transparent electrode or a semi-transparent electrode, and the second electrode 732 may be a reflective electrode. For example, the first electrode 682 may include a transparent conductive material such as indium tin oxide, zinc tin oxide, indium zinc oxide, zinc oxide, tin oxide, gallium oxide, etc. The second electrode 732 may include a reflective material such as aluminum, tungsten, copper, nickel, chromium, molybdenum, titanium, platinum, silver, tantalum, ruthenium, alloys thereof, nitrides thereof, etc.

An upper substrate 742 may be disposed on the second electrode 732. The upper substrate 742 may include a flexible substrate. In example embodiments, the flexible substrate 110 and the upper substrate 742 may include substantially the same materials or different materials. In this case, the flexible substrate 110 may correspond to a lower substrate.

FIGS. 8, 9, 10, 11, 12, and 13 are diagrams illustrating a method of manufacturing the flexible display device.

Referring to FIGS. 8, 9, 10, 11, 12, and 13, a flexible substrate 110 may include a display region having a first display region I and a second display region II and a peripheral region substantially surrounding the display region. In this case, the first display structure may be disposed (or located) at the first display region I, and the second display structure may be disposed (or located) at the second display region II. In example embodiments, the first display structure and the second display structure may be formed on a same layer. (e.g., the flexible substrate 110) In this case, the first display structure may have a structure substantially the same as or substantially similar to the second display structure. Hereinafter, for the sake of convenience, only the method of manufacturing the first display structure will be illustrated.

Figure 8:
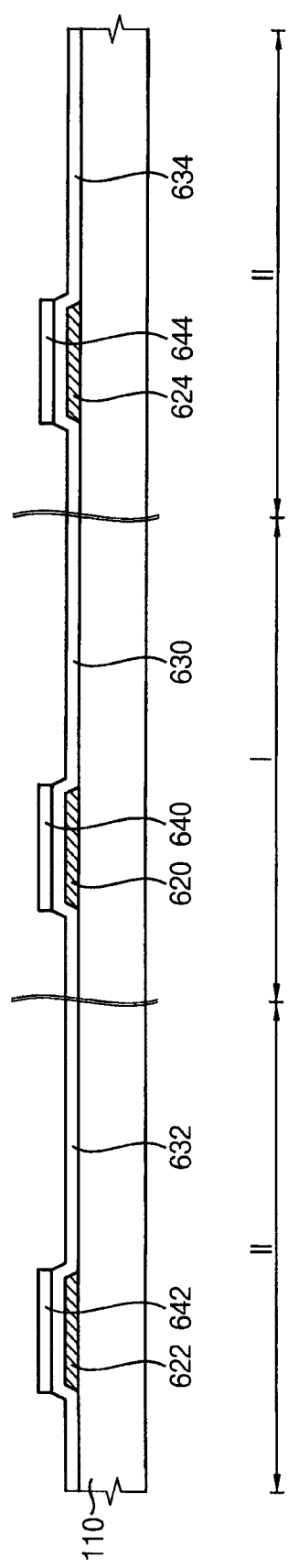
FIGS. 8, 9, 10, 11, 12, and 13 are diagrams illustrating a method of manufacturing the flexible display device according to one embodiment of the present invention.

Referring to FIG. 8, a gate electrode 620 may be formed on the flexible substrate 110.

In example embodiments, a first conductive layer may be formed on the flexible substrate 110. Thereafter, the first conductive layer may be partially etched by a photolithography process or an etching process using an additional etching mask. Hence, the gate electrode 620 may be provided on the flexible substrate 110. The first conductive layer may be formed by a sputtering process, a chemical vapor deposition (CVD) process, an atomic layer deposition (ALD) process, a vacuum evaporation process, a printing process, or the like. The gate electrode 620 may include a conductive material, a heat resistance material, and/or a transparent conductive material. These may be used alone or in a combination thereof.

A buffer layer may be disposed on the flexible substrate 110. In example embodiments, the buffer layer may prevent (or mitigate) diffusion of metal atoms and/or impurities from the flexible substrate 110. The buffer layer may have a single layer structure or a multi layer structure, which may include silicon oxide, silicon oxynitride, silicon nitride, etc. In the case that the flexible substrate 110 has a relatively irregular surface, the buffer layer may improve flatness of the surface of the flexible substrate 110. Furthermore, when the buffer layer is on the flexible substrate 110, the gate electrode 620 may be easily formed, as stress generated during forming the gate electrode 620 may be decreased by the buffer layer.

A gate insulating layer 630 may be formed on the gate electrode 620 to cover the gate electrode 620. The gate insulating layer 630 may be formed by a CVD process, a thermal oxidation process, a plasma enhanced chemical vapor deposition (PECVD) process, a high density plasma-chemical vapor deposition (HDP-CVD) process, or the like. The gate insulating layer 630 may include silicon oxide, metal oxide, etc. For example, the gate insulating layer 630 may include silicon oxide, silicon oxynitride, hafnium oxide (HfOx), zirconium oxide (ZrOx), aluminum oxide (AlOx), tantalum oxide (TaOx), etc. These may be used alone or in a combination thereof.

Referring now to FIG. 8, an active layer 640 may be formed on a portion of the gate insulating layer 630 under which the gate electrode 620 is located. In example embodiments, a semiconductor oxide layer may be formed on the gate insulating layer 630. Thereafter, the semiconductor oxide layer may be partially etched by a photolithography process or an etching process using an additional etching mask. Hence, the active layer 640 may be provided on the gate insulating layer 630. The semiconductor oxide layer may be formed by a sputtering process, a CVD process, a printing process, a spray process, a vacuum evaporation process, an ALD process, a sol-gel process, a PECVD process, or the like. The active layer 640 may include a binary compound containing indium, zinc, gallium, titanium, aluminum, halfnium, zirconium, magnesium, or the like, a ternary compound, e.g., including such elements, a quaternary compound, e.g., including such elements, or the like. In other example embodiments, the active layer 640 may include a semiconductor oxide doped with lithium, sodium, manganese, nickel, palladium, copper, carbon, nitrogen, phosphorus, titanium, zirconium, vanadium, rubidium, germanium, tin, fluorine, or the like. These may be used alone or in a mixture thereof.

Figure 9:
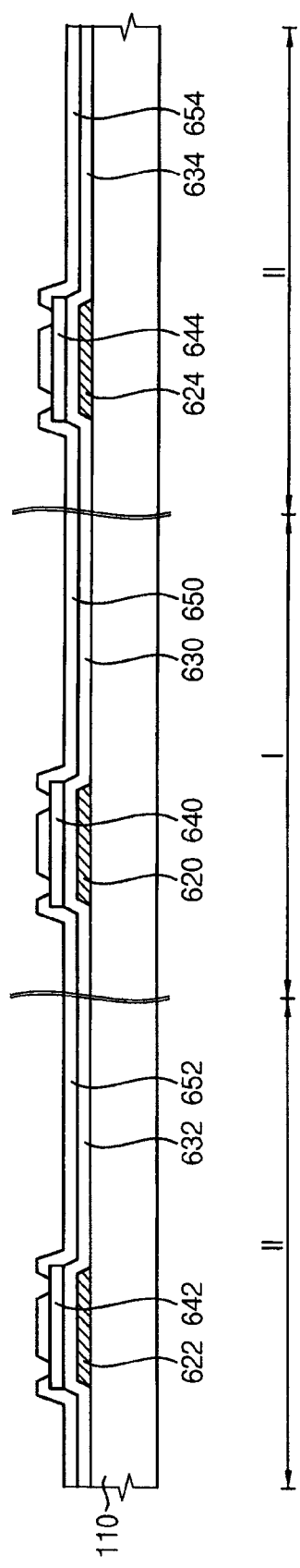

Referring to FIG. 9, a first insulating interlayer 650 may be disposed on the gate insulating layer 630 to cover the gate insulating layer 630 and the active layer 640. In example embodiments, the first insulating interlayer 650 may be formed by a CVD process, a thermal oxidation process, a PECVD process, a HDP-CVD process, or the like. The first insulating interlayer 650 may include silicon oxide, metal oxide, etc. For example, the first insulating interlayer 650 may include silicon oxide, silicon oxynitride, hafnium oxide, zirconium oxide, aluminum oxide, tantalum oxide, etc. These may be used alone or in a combination thereof. Contact holes may be formed by passing through the first insulating interlayer 650.

Figure 10:
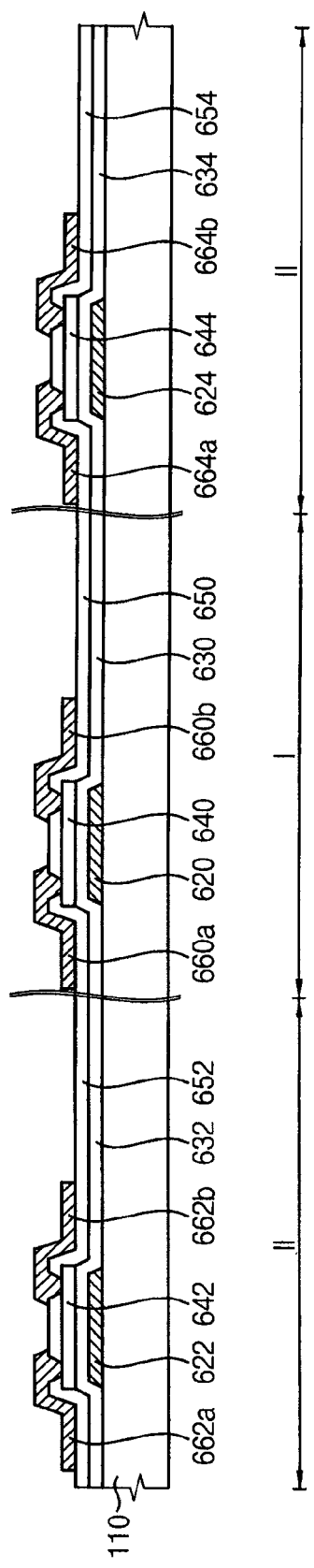

Referring to FIG. 10, the source and drain electrodes 660*a*, 660*b* may be formed in the contact holes. In example embodiments, a second conductive layer for forming the source and drain electrodes 660*a*, 660*b* may be formed on the gate insulating layer 630. Thereafter, the second conductive layer may be partially etched by a photolithography process or an etching process using an additional etching mask. Hence, the source and drain electrodes 660*a*, 660*b* may be provided on the flexible substrate 110. The second conductive layer may be formed by a sputtering process, a CVD process, an ALD process, a vacuum evaporation process, a printing process, or the like. The source and drain electrodes 660*a*, 660*b* may include metal, alloy, conductive metal oxide, a transparent conductive material, etc. In example embodiments, the source and drain electrodes 660*a*, 660*b* have a single layer structure or a multi layer structure, which may include a conductive material, a heat resistant material and/or a transparent conductive material.

Figure 11:
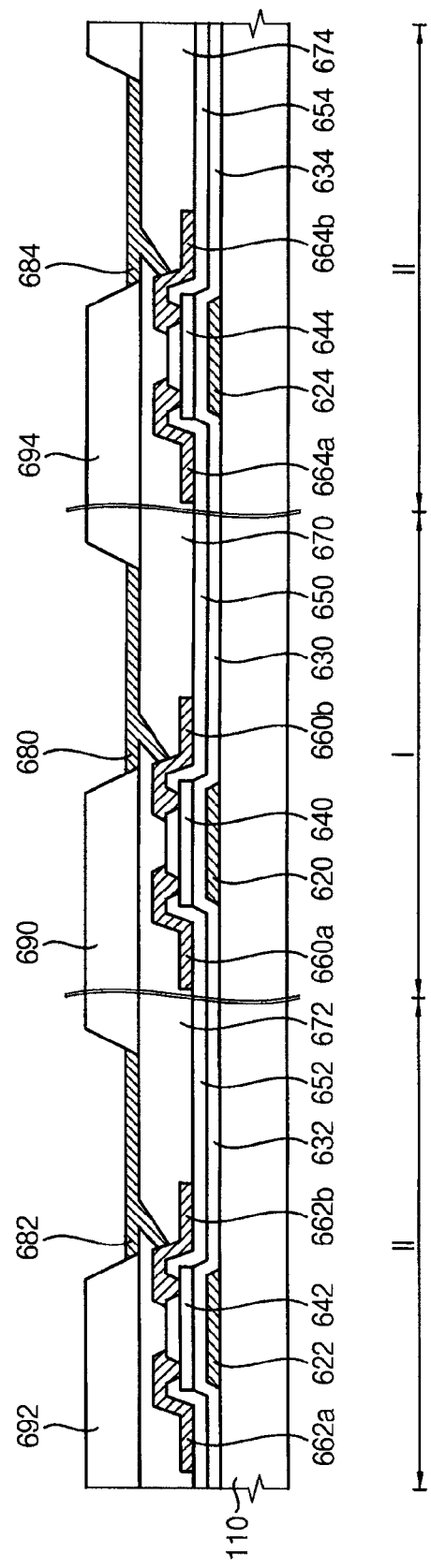

Referring to FIG. 11 a first electrode 680 electrically connected with the drain electrode 660*b* may be formed on the second insulating interlayer 670. In example embodiments, the second insulating interlayer 670 may be partially etched to form a contact hole exposing at least a portion of the drain electrode 660*b*. A third conductive layer sufficiently filling the contact hole may be formed on the second insulating interlayer 670 and the drain electrode 660*b*. The third conductive layer may be patterned to form the first electrode 680. The third conductive layer may be formed using a transparent conductive material including, e.g., ITO, ZTO, IZO, ZnOx, SnOx, GIZO, AZO, etc., or a metal including, e.g., Ag, Al, Pt, Au, Cr, W, Mo, Ti, Pd, etc., or an alloy of these materials. The third conductive layer may be obtained by a sputtering process, a CVD process, an ALD process, a pulsed laser deposition process, a vacuum evaporation process, a printing process, etc. The first electrode 110 may serve as an anode providing holes. In one example embodiment, the first electrode 680 may have a multi-layered structure including a transparent conductive material layer and a metal layer. The first electrode 680 may serve as an anode for providing holes into the light emitting structure.

Referring now to FIG. 11, a pixel defining layer 690 may be formed on the second insulating interlayer 670. In this case, the pixel defining layer 690 may be formed adjacent to the first electrode 680, and a portion of the pixel defining layer 690 may be overlapped with the first electrode 680. In example embodiments, the pixel defining layer 690 may include a polymer containing a carbon-carbon chain. The pixel defining layer 690 may serve as an insulator.

Figure 12:
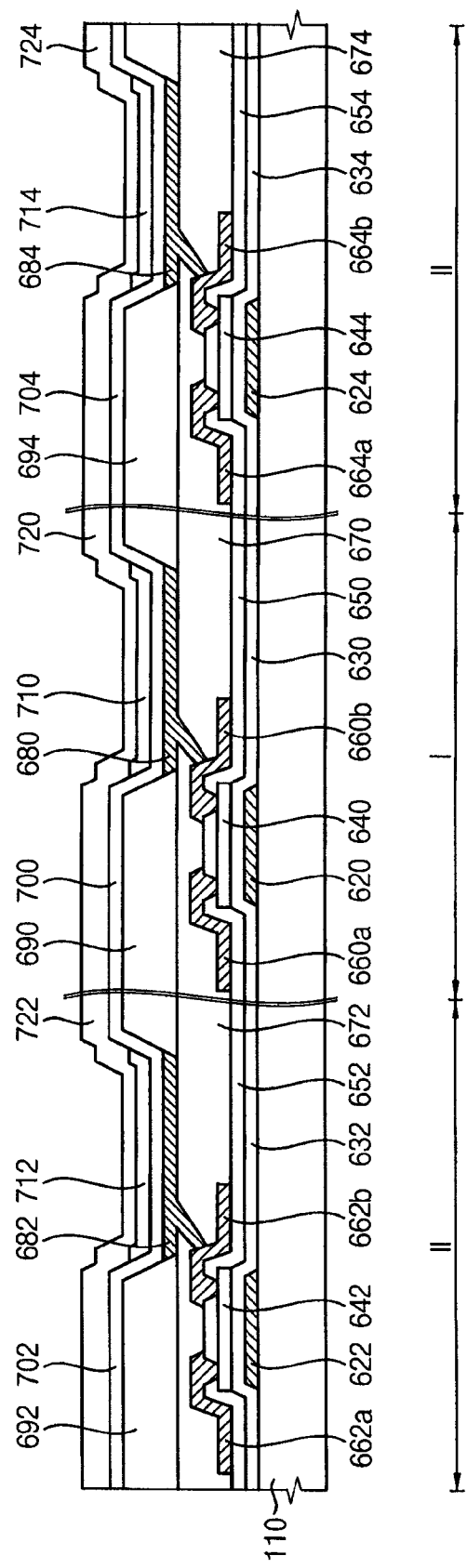

Referring to FIG. 12, a first organic layer 700, an organic light emitting layer 710, and a second organic layer 720 may be formed on the second insulating interlayer 670 to cover the first electrode 680.

In example embodiments, at least one of the first organic layer 700, the organic light emitting layer 710, and the second organic layer 720 may include a nanoparticle (or nanoparticles). In this case, the nanoparticle may include at least one of the carbon nano tube, the quantum dot, graphene, and fullerene. The first organic layer 700, the organic light emitting layer 710, and the second organic layer 720 may be formed by an inkjet printing process, a screen printing process, a nozzle printing process, a spray coating process, a slit coating process, a bar coating process, and a spin coating process.

Therefore, the flexible display device according to example embodiments includes the first display structure. In this case, the first display structure may include a nanoparticle (or nanoparticles). Accordingly, the flexible display device according to example embodiments of the present invention may improve flexibility of the flexible display devices. When the flexible display device is substantially bent or curved, damage to the flexible display device may be prevented or mitigated due to the first display structure. As a result, portability of the flexible display device may be improved.

Figure 13:
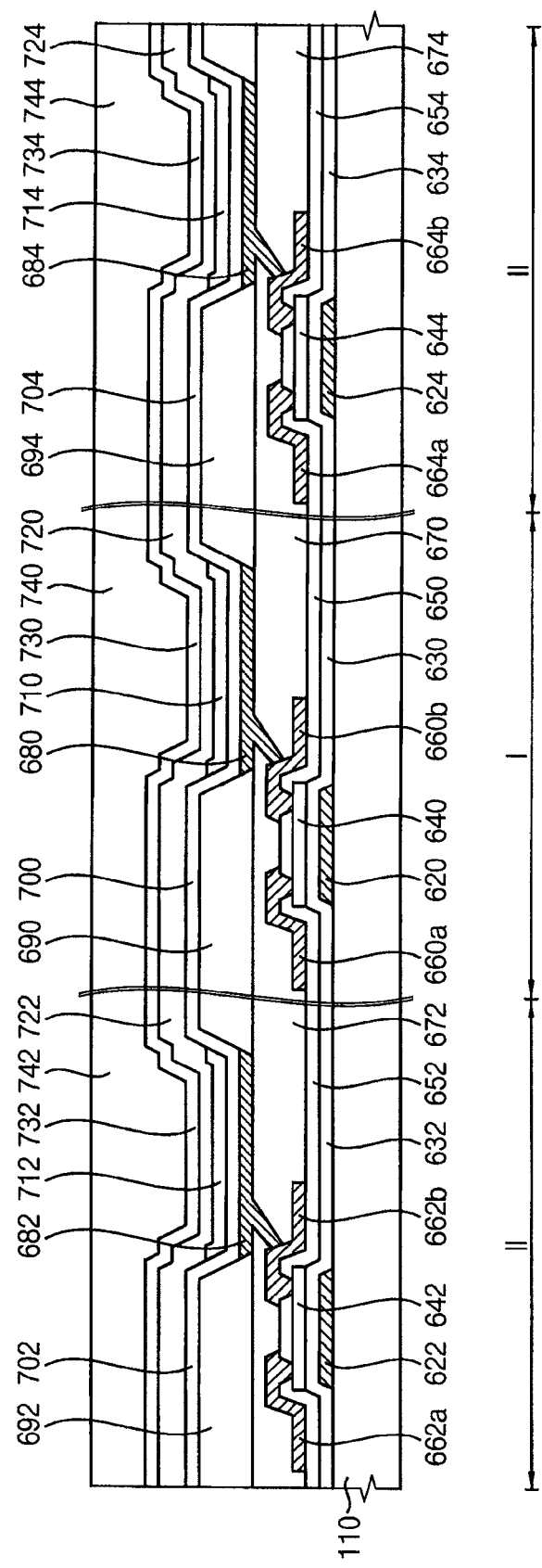

Referring to FIG. 13, a second electrode 730 and an upper substrate 740, etc. may be formed on the second organic layer to obtain the flexible display device according to example embodiments of the present invention.

According to example embodiments of the invention, the flexible display device may be employed in general display apparatuses and various recent electronic apparatuses such as e-books, customer products, etc.

The foregoing is illustrative of example embodiments and is not to be construed as limiting thereof. Although a few example embodiments have been described as examples, those skilled in the art will readily appreciate that many modifications are possible in the example embodiments of the present invention without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments that serve as examples and is not to be construed as limited to the specific example embodiments disclosed, and that modifications to the disclosed example embodiments, as well as other example embodiments, are intended to be included within the scope of the appended claims.

What is claimed is:

1. A method of manufacturing a flexible display device, the method comprising:
   providing a flexible substrate comprising a display region and a peripheral region substantially surrounding the display region, the display region comprising a first display region and a second display region;
   forming a first display structure at the first display region of the flexible substrate, the first display structure comprising nanoparticles, wherein the nanoparticles comprise at least one of a carbon nano tube, graphene, and fullerene;
   forming a second display structure at the second display region of the flexible substrate, the second display structure comprising silicon;
   wherein the first display structure comprises;
   forming a switching element on the flexible substrate;
   forming a first electrode electrically connected to the switching element;
   forming a light emitting structure on the first electrode;
   forming a second electrode on the light emitting structure,
   wherein at least one of the switching element, the first electrode, the light emitting structure, and the second electrode comprises the nanoparticles;
   wherein forming the light emitting structure comprises;
   forming a first organic layer;
   forming an organic light emitting layer on the first organic layer;
   forming a second organic layer on the organic light emitting layer, and wherein at least one of the first organic layer, the organic light emitting layer, and the second organic layer comprises the nanoparticles.

2. The method of claim 1, wherein the light emitting structure is formed by at least one of an inkjet printing process, a screen printing process, a nozzle printing process, a spray coating process, a slit coating process, a bar coating process, and a spin coating process.

3. The method of claim 2, wherein the first organic layer comprises at least one of a hole injection layer and a hole transport layer, and the second organic layer comprises at least one of an electron transport layer and an electron injection layer.

4. A method of manufacturing a flexible display device, the method comprising:
providing a flexible substrate comprising a display region and a peripheral region substantially surrounding the display region, the display region comprising a first display region and a second display region;
forming a first display structure at the first display region of the flexible substrate, the first display structure comprising a first electrode, a second electrode, and a light emitting structure between the first electrode and the second electrode, the light emitting structure comprising nanoparticles, wherein the nanoparticles comprise at least one of a carbon nano tube, graphene, and fullerene; and
forming a second display structure at the second display region of the flexible substrate, the second display structure comprising silicon.

5. The method of claim 4, further comprising:
forming a housing on a back side of the flexible substrate, the housing comprising a flexible material and adapted to enable a folding operation of the flexible display device.

6. The method of claim 4, further comprising:
forming a housing on a back side of the flexible substrate, the housing comprising a non-flexible material, and the housing comprising a hinge adapted to enable a folding operation of the flexible display device.

7. The method of claim 4, wherein the first display region and the second display region are continuously arranged, and the second display region is at both sides of the first display region.

8. The method of claim 4, wherein forming the first display structure comprises:
forming a switching element on the flexible substrate;
forming the first electrode, the first electrode being electrically connected to the switching element;
forming the light emitting structure on the first electrode; and
forming the second electrode on the light emitting structure, and
wherein at least one of the switching element, the first electrode, the light emitting structure, and the second electrode comprises the nanoparticles.

* * * * *